United States Patent
Cai et al.

(10) Patent No.: US 10,643,923 B2
(45) Date of Patent: May 5, 2020

(54) CASE AND ELECTRONIC DEVICE HAVING THE SAME

(71) Applicant: SUNGROW POWER SUPPLY CO., LTD., Hefei, Anhui (CN)

(72) Inventors: Qu'e Cai, Anhui (CN); Yonghong Li, Anhui (CN); Puyun Dong, Anhui (CN); Jianhua Mao, Anhui (CN); Long Liu, Anhui (CN)

(73) Assignee: SUNGROW POWER SUPPLY CO., LTD., Hefei, Anhui (CN)

( * ) Notice: Subject to any disclaimer, the term of this patent is extended or adjusted under 35 U.S.C. 154(b) by 375 days.

(21) Appl. No.: 15/608,471

(22) Filed: May 30, 2017

(65) Prior Publication Data

US 2018/0096911 A1    Apr. 5, 2018

(30) Foreign Application Priority Data

Sep. 30, 2016  (CN) .................... 2016 2 1099885 U

(51) Int. Cl.
| | | |
|---|---|---|
| *H01L 23/40* | (2006.01) | |
| *H05K 7/20* | (2006.01) | |
| *H05K 5/02* | (2006.01) | |
| *H05K 7/14* | (2006.01) | |

(52) U.S. Cl.
CPC ........... *H01L 23/40* (2013.01); *H05K 5/0213* (2013.01); *H05K 7/1428* (2013.01); *H05K 7/20172* (2013.01); *H05K 7/20918* (2013.01); *H01L 2023/4037* (2013.01)

(58) Field of Classification Search
CPC ...................................................... H01L 23/40
USPC ..................................................... 361/679.51
See application file for complete search history.

(56) References Cited

U.S. PATENT DOCUMENTS

| | | | |
|---|---|---|---|
| 4,126,269 A | 11/1978 | Bruges | |
| 4,520,425 A | 5/1985 | Ito | |
| 6,115,250 A * | 9/2000 | Schmitt | H05K 7/20727 165/104.34 |
| 2005/0237712 A1* | 10/2005 | Li | G06F 1/183 361/679.48 |
| 2007/0279865 A1 | 12/2007 | Yoshida et al. | |
| 2011/0188280 A1 | 8/2011 | Nagano et al. | |

(Continued)

FOREIGN PATENT DOCUMENTS

| | | |
|---|---|---|
| DE | 102013109575 A1 | 3/2015 |
| JP | 2001148588 A | 5/2001 |

OTHER PUBLICATIONS

Extended European Search Report corresponding to Application No. 17173297.7-1803; dated Dec. 20, 2017.

*Primary Examiner* — Mukundbhai G Patel
(74) *Attorney, Agent, or Firm* — Cantor Colburn LLP

(57) ABSTRACT

A case and an electronic device having the case are provided according to the present application. A fan is arranged on a case wall of the case, an air inlet and an air outlet in communication with the air inlet are arranged in the case wall. The fan is arranged inside the case and is located between the air inlet and the air outlet. Each of the fan is mounted in a bottom-to-top manner with its air inlet facing downwards and its air outlet facing upwards. The air inlet is located at a lower end of the case, the air outlet is located at an upper end of the case, and an air duct from bottom to top is formed by the air inlet, the fan and the air outlet.

12 Claims, 2 Drawing Sheets

(56) References Cited

U.S. PATENT DOCUMENTS

| | | | |
|---|---|---|---|
| 2012/0250247 A1* | 10/2012 | Chien | H05K 7/1487 |
| | | | 361/679.48 |
| 2014/0016269 A1* | 1/2014 | Yoshida | H05K 7/20172 |
| | | | 361/695 |
| 2014/0063739 A1 | 3/2014 | Liu et al. | |

* cited by examiner

CASE AND ELECTRONIC DEVICE HAVING THE SAME

CROSS-REFERENCE TO RELATED APPLICATIONS

This application claims the benefit of priority claims priority under 35 U.S.C. § 119 to Chinese Patent Application No. 201621099885.6 titled "CASE AND ELECTRONIC DEVICE HAVING THE SAME" and filed with the Chinese State Intellectual Property Office on Sep. 30, 2016, the entire disclosure of which is incorporated herein by reference.

FIELD

This application relates to a case and an electronic device having the case.

BACKGROUND

As the market competition becomes more and more intense, an inverter is required to an increasingly higher power, an increasingly smaller volume, and an increasingly lower weight. The higher the power of the inverter is, the higher the heat may be generated by the inverter. If heat is dissipated only by a heat dissipator itself, the volume of the heat dissipator may be inevitably large, which does not meet the market requirement. Therefore, it is necessary to use a forced air cooling to dissipate heat, and only in this way, the volume of the heat dissipator can be reduced, and the weight thereof can be lowered. It is inevitable to use fans when employing the forced air cooling, and the mounting positions of the fans directly influence the usage environment of the fans. Air inlets of fans of conventional products are generally exposed outside, which is adverse to prevent invasions by sand wind, and has a quite average heat dissipation effect.

SUMMARY

In view of the above technical defects, a case and an electronic device having the case are provided according to the present application, the case has a fan mounted in a hidden manner, thus addressing the issues that the fan is apt to be invaded by sand wind and rain, and a mounting direction of the fan is from top to bottom which is exactly the same as the direction of gravity, therefore, it is difficult for dust to be accumulated on the fan, and the service life and reliability of the fan are ensured.

A case is provided according to the solution of the present application, a fan is arranged on a case wall of the case, an air inlet and an air outlet in communication with the air inlet are arranged in the case wall of the case. The fan is arranged inside the case and is located between the air inlet and the air outlet; the fan is mounted in a bottom-to-top manner with an air inlet of the fan facing downwards and an air outlet of the fan facing upwards; the air inlet is located at a lower end of the case, the air outlet is located at an upper end of the case, and an air duct from bottom to top is formed by the air inlet, the fan and the air outlet.

As a further improvement of the above solution, a lower end and an upper end of the same side wall of the case are respectively provided with at least one air inlet and at least one air outlet.

As a further improvement of the above solution, the air inlet of the fan is provided with a dust screen.

As a further improvement of the above solution, the fan is mounted inside the case via a mounting mechanism.

Further, the mounting mechanism includes one mounting plate, one guide slot, each of the fan is mounted on the mounting plate, and the mounting plate is inserted into the guide slot from one side of the guide slot; or, the mounting mechanism includes two mounting plates and one guide slot, and in a case that the number of the fan is plural, the plurality of fans are divided into two groups and the two groups of fans are respectively mounted on the two mounting plates, and the two mounting plates are inserted into the guide slot respectively from two opposite sides of the guide slot.

Still further, the mounting mechanism further includes a baffle, the baffle is mounted in the guide slot, and an end, inserted into the guide slot, of the mounting plate is provided with a clamp slot, and the clamp slot is engaged with a side of the baffle facing the corresponding clamp slot after the mounting plate is inserted into the guide slot.

Further, the mounting mechanism further includes a positioning plate, and the positioning plate has one end fixed to the mounting plate and another end configured to be fixed to a side wall of the case by several fasteners after the mounting plate is inserted into the guide slot.

Still further, the positioning plate and the mounting plate are configured as an integrally formed structure.

As a further improvement of the above solution, a heat dissipator is arranged in the air duct and between the fan and the air outlet.

The present application further relates to an electronic device, which includes a case, and a circuit part and a plurality of heat generating elements mounted in the case, and the case is the case according to any one of the above solutions. The case is configured to include a front case body and a rear case body; the plurality of heat generating elements and the air duct of the case are arranged inside the rear case body, and the circuit part is arranged inside the front case body.

Compared with the conventional technology, the present application has the following advantages.

1. The fan is mounted in a relatively concealed location, and is not apt to be invaded by sand wind and rain, which facilitates improving the reliability of the fan.
2. The heat dissipator or the heat generating element may dissipate heat rapidly and uniformly.
3. The fan can be detached and mounted rapidly.
4. The fan in the conventional technology are located at a lateral side of the case, and are apt to be invaded by sand wind and rain; however, the fan according to the present application is located in the concealed location, which facilitates preventing the fan from being adversely affected by ambient environment.
5. In the case that the fan is located at the lateral side of the machine, the heat of the heat dissipator located away from the fan cannot be brought away rapidly, which is apt to cause non-uniform heat dissipation of the heat dissipator. However, in the case that the fan is located at the lower middle part of the case as in the present application, the heat of the heat dissipator can be brought away rapidly, thus the reliability of the machine can be greatly improved.

DETAILED DESCRIPTION

In order to make objects, technical solutions and advantages of the present application clearer, the present application is further described in detail hereinafter in conjunction with drawings and embodiments. It should be appreciated that, the embodiments described here are only intended to explain the present application, and are not intended to limit the present application.

Figure 1:
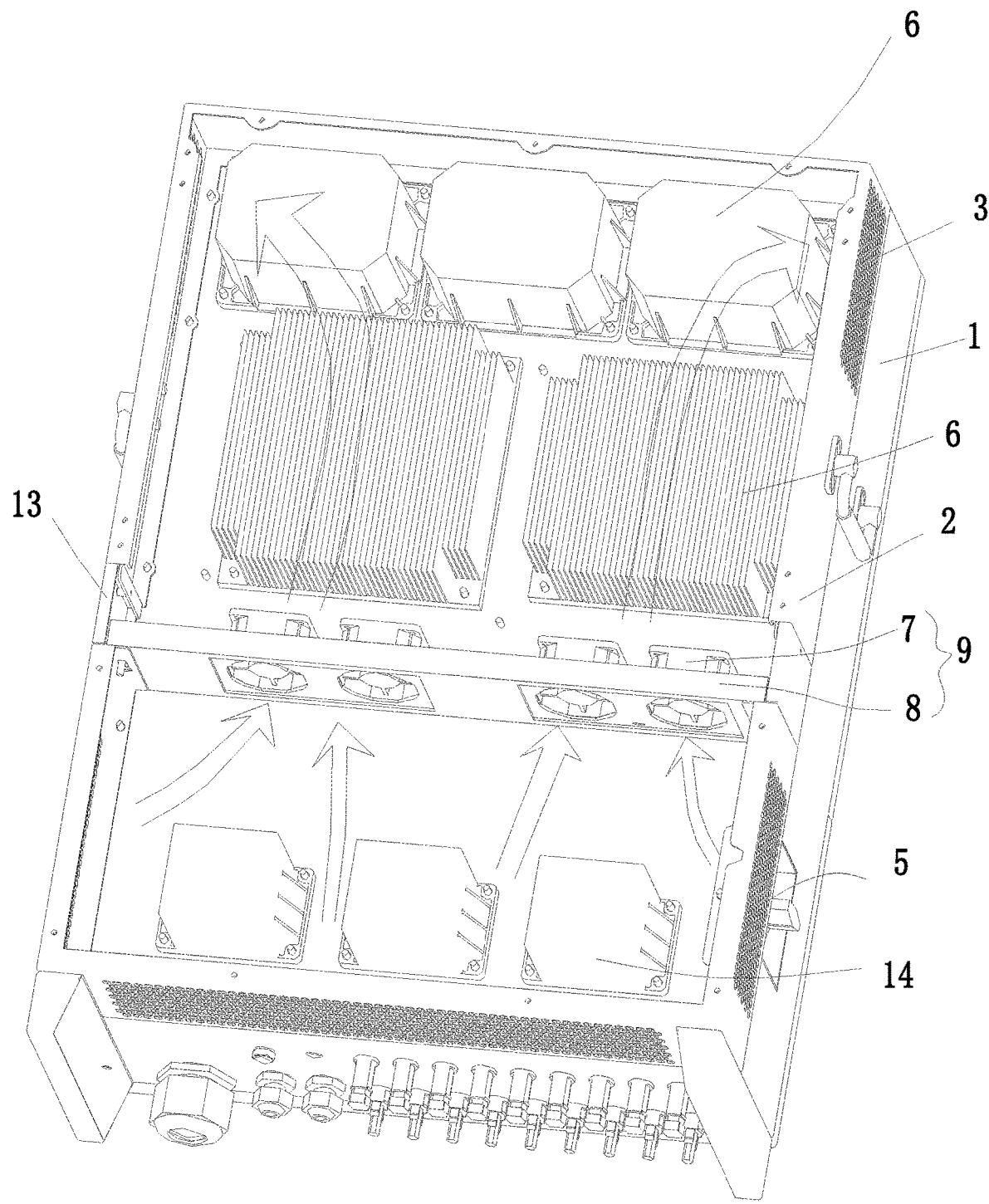
FIG. 1 is a perspective view of an electronic device according to the present application with a side wall being removed.
Figure 2:
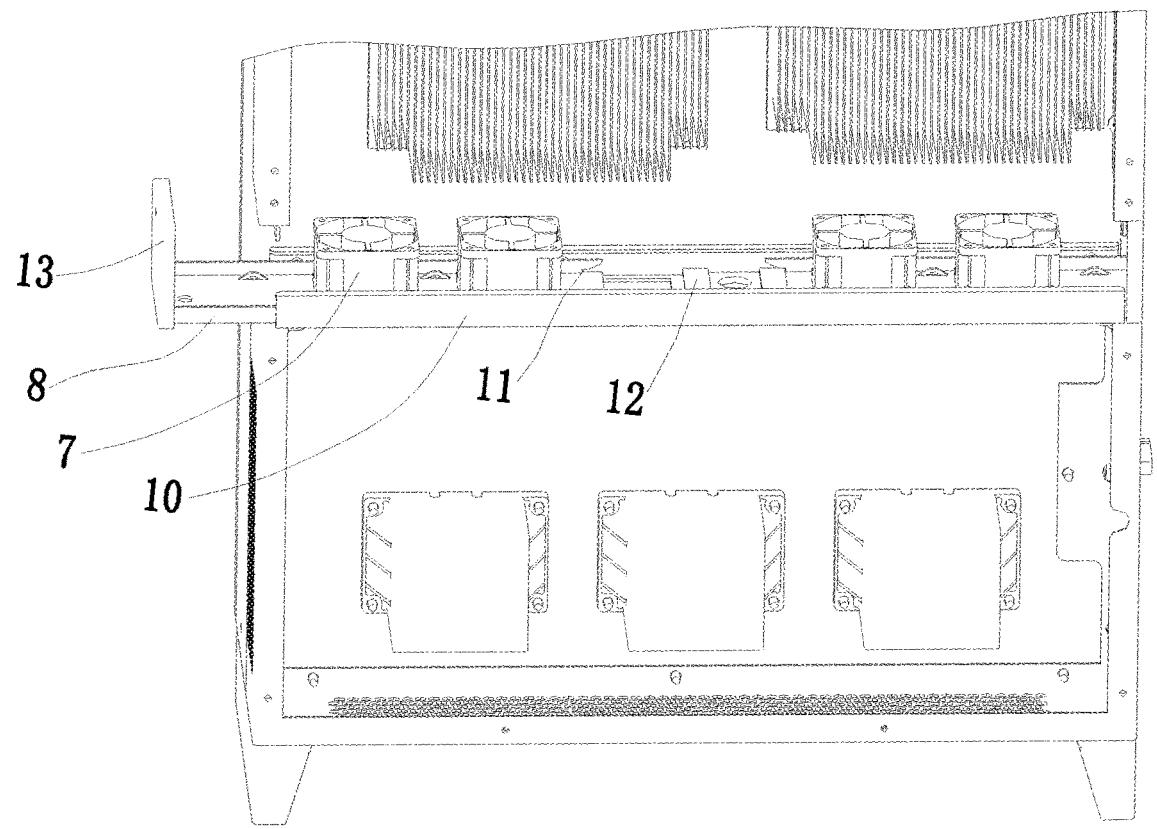
FIG. 2 is a partial view of FIG. 1 from another view angle.

Reference is made to FIGS. 1 and 2, an electronic device according to the present application is exemplarily illustrated by taking an inverter as an example. The electronic device includes a case, and a circuit part (not illustrated) and several heat generating elements 14 mounted in the case.

A fan 7 and a mounting mechanism for mounting the fan 7 in the case are arranged on a case wall of the case, and an air inlet 5 and an air outlet 3 in communication with the air inlet 5 are arranged in the case wall of the case. It may be appreciated that, the number of the fan 7 is one or more, the number of the air inlet 5 is one or more, and the number of the air outlet 3 is one or more.

The fan 7 is arranged inside the case and is located between the air inlet 5 and the air outlet 3. Each of the fan 7 is mounted in a bottom-to-top manner with its air inlet facing downwards and its air outlet facing upwards. The air inlet 5 is located at a lower end of the case, and the air outlet 3 is located at an upper end of the case, and an air duct from bottom to top is formed by the air inlet 5, the fan 7 and the air outlet 3. One or more heat dissipators 6 may be provided in the air duct and between the fan 7 and the air outlet 3. The formed air duct is from bottom to top, which facilitates rapid and uniform heat dissipation of the heat dissipators 6.

The case may be configured to include a front case body 1 and a rear case body 2. The heat dissipators 6, the heat generating elements 14 and the air duct of the case and the like have a low waterproofing grade and are thus arranged inside the rear case body 2. The circuit part has a high waterproofing grade and is thus arranged inside the front case body 1. A lower end and an upper end of the same side wall of the case may be respectively provided with at least one air inlet 5 and at least one air outlet 3.

The fan 7 is mounted at a lower middle part of the rear case body 2, the air inlet 5 is located at a lower part of the rear case body 2, and the air outlet 3 is located at two sides or an upper part of the rear case body 2, thereby forming the air duct from bottom to top, which facilitates uniform heat dissipation of the heat dissipators 6. The air inlet of each of the fan 7 may be provided with a dust screen, and with the isolation by the dust screen, it is difficult for the sand wind and rain to invade the fan. In addition, when the inverter works normally after being hanged on the wall, the mounting direction of the fan 7 is from top to bottom, which is exactly the same as the direction of gravity, therefore, it is difficult for dust to be accumulated on the fan 7, thus ensuring the service life and reliability of the fan 7.

Figure 3:
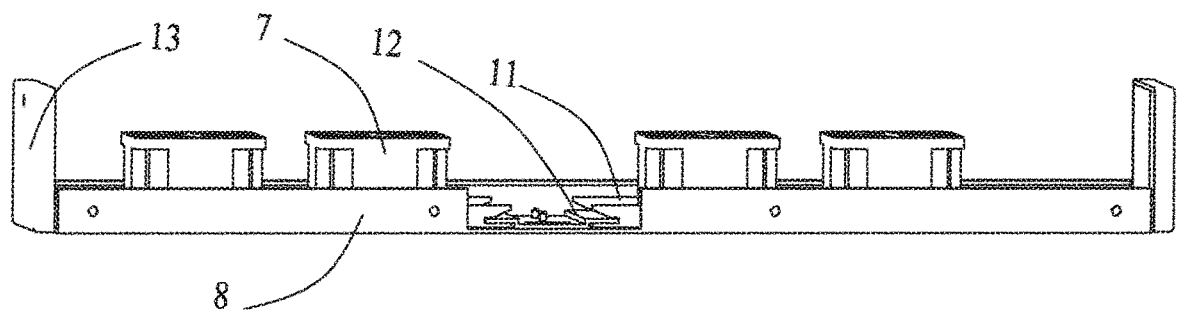
FIG. 3 is a schematic view showing the structure of a mounting mechanism in FIG. 1.

The fan 7 can be mounted in various ways, and may be directly fixed or indirectly fixed. In the present application, for ensuring that the fan 7 can be detached and mounted rapidly, the fan 7 is mounted in the case via a mounting mechanism, and reference may be made to FIG. 3. The mounting mechanism may include one mounting plate 8, one guide slot 10, each of the fan 7 is mounted on the mounting plate 8, and the mounting plate 8 is inserted into the guide slot 10 from one side of the guide slot 10. The mounting mechanism may also include two mounting plates 8, one guide slot 10, and in the case that the number of the fan 7 is plural, the multiple fans 7 are divided into two groups and the two groups of the fans 7 are respectively mounted on the two mounting plates 8, and the two mounting plates 8 are inserted into the guide slot 10 respectively from two opposite sides of the guide slot 10, and this is the structure of this embodiment.

For making the fan 7 stable, the mounting mechanism may further include a baffle 12. The baffle 12 is mounted in the guide slot 10, and an end, inserted into the guide slot 10, of the mounting plate 8 is provided with a clamp slot 11. The clamp slot 11 can be engaged with a side of the baffle 12 that is facing the corresponding clamp slot 11 after the mounting plate 8 is inserted into the guide slot 10.

For making the fan 7 more stable, the mounting mechanism may further include a positioning plate 13. The positioning plate 13 has one end fixed to the mounting plate 8 and another end configured to be fixed to a side wall of the case by several fasteners (such as screws or bolts) after the mounting plate 8 is inserted into the guide slot 10. The positioning plate 13 and the mounting plate 8 may be configured as an integrally formed structure, to increase the structural strength of the mounting structure.

The fan 7 and the mounting plate 8 may form an integrated fan assembly 9, and in the mounting and detaching processes, the fan assembly 9 is regarded as an integrated part, which facilitates the detaching process. The fan assembly 9 is inserted in the guide slot 10 till the clamp slot 11 is engaged with the baffle 12. The mounting plate 8 and the rear case body 2 are fixed by fasteners such as screws or buckles externally, thus ensuring the rapid detaching and mounting of the fan assembly 9.

The above described embodiments are only preferred embodiments of the present application, and are not intended to limit the present application, and any modifications, equivalent substitutions and improvements made within the spirit and principle of the present application are deemed to fall within the scope of protection of the present application.

What is claimed is:

1. A case, comprising a fan arranged on a case wall of the case, an air inlet and an air outlet in communication with the air inlet arranged in the case wall of the case; wherein, the fan is arranged inside the case and is located between the air inlet and the air outlet; the fan is mounted in a bottom-to-top manner with an air inlet of the fan facing downwards and an air outlet of the fan facing upwards; the air inlet is located at a lower end of the case, the air outlet is located at an upper end of the case, and an air duct from bottom to top is formed by the air inlet, the fan and the air outlet; and wherein the fan is mounted inside the case via a mounting mechanism;

the mounting mechanism comprises one mounting plate, one guide slot, each of the fan is mounted on the mounting plate, and the mounting plate is inserted into the guide slot from one side of the guide slot or the mounting mechanism comprises two mounting plates and one guide slot, in a case that the number of the fan is plural, the plurality of fans are divided into two groups and the two groups of fans are respectively mounted on the two mounting plates, and the two mounting plates are inserted into the guide slot respectively from two opposite sides of the guide slot; and the mounting mechanism further comprises a baffle, the baffle is mounted in the guide slot, and an end, inserted into the guide slot, of the mounting plate is provided with a clamp slot, and the clamp slot is engaged with a side of the baffle facing the corresponding clamp slot after the mounting plate is inserted into the guide slot.

2. The case according to claim 1, wherein a lower end and an upper end of the same side wall of the case are respectively provided with at least one air inlet and at least one air outlet.

3. The case according to claim 1, wherein the air inlet of the fan is provided with a dust screen.

4. The case according to claim 1, wherein the mounting mechanism further comprises a positioning plate, the positioning plate has one end fixed to the mounting plate and another end configured to be fixed to a side wall of the case by a plurality of fasteners after the mounting plate is inserted into the guide slot.

5. The case according to claim 4, wherein the positioning plate and the mounting plate are configured as an integrally formed structure.

6. The case according to claim 1, wherein a heat dissipator is arranged in the air duct and between the fan and the air outlet.

7. An electronic device, comprising a case, and a circuit part and a plurality of heat generating elements mounted in the case, wherein the case is the case according to claim 1; the case is configured to comprise a front case body and a rear case body; the plurality of heat generating elements and the air duct of the case are arranged inside the rear case body, and the circuit part is arranged inside the front case body.

8. The electronic device according to claim 7, wherein, a lower end and an upper end of the same side wall of the case are respectively provided with at least one air inlet and at least one air outlet.

9. The electronic device according to claim 7, wherein the air inlet of the fan is provided with a dust screen.

10. The electronic device according to claim 7, wherein the mounting mechanism further comprises a positioning plate, the positioning plate has one end fixed to the mounting plate and another end configured to be fixed to a side wall of the case by a plurality of fasteners after the mounting plate is inserted into the guide slot.

11. The electronic device according to claim 10, wherein the positioning plate and the mounting plate are configured as an integrally formed structure.

12. The electronic device according to claim 7, wherein a heat dissipator is arranged in the air duct and between the fan and the air outlet.

* * * * *